(12) United States Patent
Yang et al.

(10) Patent No.: US 8,759,814 B2
(45) Date of Patent: Jun. 24, 2014

(54) SEMICONDUCTOR LIGHT-EMITTING DEVICE AND MANUFACTURING METHOD THEREOF

(75) Inventors: Chih-Chung Yang, Taipei (TW); Che-Hao Liao, Taipei (TW); Shao-Ying Ting, Taipei (TW); Horng-Shyang Chen, Taipei (TW); Wen-Ming Chang, Taipei (TW); Yu-Feng Yao, Taipei (TW); Chih-Yen Chen, Taipei (TW); Hao-Tsung Chen, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/615,548

(22) Filed: Sep. 13, 2012

(65) Prior Publication Data

US 2014/0042387 A1  Feb. 13, 2014

(30) Foreign Application Priority Data

Aug. 10, 2012 (TW) .............................. 101129045 A

(51) Int. Cl.
*H01L 31/00* (2006.01)

(52) U.S. Cl.
USPC ................. 257/13; 257/98; 257/461; 257/89; 257/79; 257/103; 438/29; 438/27

(58) Field of Classification Search
CPC ...................... H01L 21/0254; H01L 21/02603; H01L 21/02609; H01L 21/02636; H01L 21/02639; H01L 21/02642; H01L 31/0304; H01L 31/035236; H01L 31/184; H01L 33/18; H01L 33/24; H01L 33/04; H01L 33/44; H01L 29/2003; H01L 2003/775
USPC ............ 257/98, 89, 79, 103, 461; 438/27, 29; 428/172
See application file for complete search history.

(56) References Cited

U.S. PATENT DOCUMENTS 5,799,027 A * 8/1998 Anayama et al. ........... 372/45.01
6,091,083 A * 7/2000 Hata et al. ....................... 257/79
(Continued)

FOREIGN PATENT DOCUMENTS

CN  101138091  3/2008
TW  560119  11/2003

OTHER PUBLICATIONS

Liang et al., "Built-in Electric Field Minimization in (In, Ga)N Nanoheterostructures," Nano Letters 11, Nov. 9, 2011, pp. 4515-4519.

(Continued)

*Primary Examiner* — Bac Au
*Assistant Examiner* — Sophia Nguyen
(74) *Attorney, Agent, or Firm* — Jianq Chyun IP Office

(57) ABSTRACT

A semiconductor light-emitting device and a manufacturing method thereof are provided, wherein the semiconductor light-emitting device includes a first type doped semiconductor structure, a light-emitting layer, a second type doped semiconductor layer, a first conductive layer and a dielectric layer. The first type doped semiconductor structure includes a base and a plurality of columns extending outward from the base. Each of the columns includes a top surface and a plurality of sidewall surfaces. The light-emitting layer is disposed on the sidewall surfaces and the top surface, wherein the surface area of the light-emitting layer gradually changes from one side adjacent to the columns to a side away from the columns. The dielectric layer exposes the first conductive layer locating on the top surface of each of the columns, wherein the dielectric layer includes at least one of a plurality of quantum dots, phosphors, and metal nanoparticles.

22 Claims, 11 Drawing Sheets

(56) References Cited

U.S. PATENT DOCUMENTS

| | | | |
|---|---|---|---|
| 7,254,151 B2 * | 8/2007 | Lieber et al. | 372/44.01 |
| 8,039,854 B2 | 10/2011 | Hersee et al. | |
| 8,211,597 B2 * | 7/2012 | Su et al. | 430/7 |
| 8,455,284 B2 * | 6/2013 | Seong et al. | 438/47 |
| 2003/0174752 A1 * | 9/2003 | Inomoto | 372/46 |
| 2007/0238298 A1 * | 10/2007 | Brown | 438/694 |
| 2008/0042161 A1 * | 2/2008 | Han et al. | 257/103 |
| 2008/0073743 A1 * | 3/2008 | Alizadeh et al. | 257/461 |
| 2008/0144684 A1 * | 6/2008 | Tamura et al. | 372/45.011 |
| 2009/0008664 A1 * | 1/2009 | Jin et al. | 257/98 |
| 2009/0169828 A1 * | 7/2009 | Hersee et al. | 428/172 |
| 2009/0246901 A1 * | 10/2009 | Gilet et al. | 438/29 |
| 2010/0236620 A1 * | 9/2010 | Nakanishi et al. | 136/256 |
| 2011/0169025 A1 | 7/2011 | Kishino et al. | |
| 2011/0250132 A1 * | 10/2011 | Seetharama | 424/1.65 |
| 2012/0164767 A1 * | 6/2012 | Gasse et al. | 438/27 |
| 2013/0210009 A1 * | 8/2013 | Budow et al. | 435/6.11 |
| 2013/0251995 A1 * | 9/2013 | Hao et al. | 428/402 |

OTHER PUBLICATIONS

Liao et al, "Geometry and composition comparisons between c-plane disc-like and m-plane core-shell InGaN/GaN quantum wells in a nitride nanorod," Optics Express 20(14), Jul. 2, 2012, pp. 15859-15871.

* cited by examiner

SEMICONDUCTOR LIGHT-EMITTING DEVICE AND MANUFACTURING METHOD THEREOF

CROSS-REFERENCE TO RELATED APPLICATION

This application claims the priority benefit of Taiwan application serial no. 101129045, filed on Aug. 10, 2012. The entirety of the above-mentioned patent application is hereby incorporated by reference herein and made a part of this specification.

BACKGROUND

1. Technical Field

The invention relates generally to a semiconductor device and a manufacturing method thereof. More particularly, the invention relates to a semiconductor light-emitting device and a manufacturing method thereof.

2. Related Art

With the progress in optoelectronic technologies, the manufacturing and the applications of a light-emitting diode (LED) has gradually matured. Due to the advantages of having low pollutants, low power consumption, and long lifetime, etc., the LED has been extensively applied as a light source or for illumination, such as in traffic signals, outdoor bulletin boards, and in the backlight source of displays. The LED has therefore become an important optoelectronic industry.

Nowadays, group III-V nitride materials are used in the LED. A main reason for adopting group III-V nitride materials is that most have direct bandgap structures with emitting wavelengths ranging from the infrared (IR) to the ultraviolet (UV). A required emitting wavelength can be obtained by properly adjusting the constituent proportions of the group III-V nitride materials.

However, since the positive and negative charge centers in a unit cell of the group III-V nitride materials do not overlap, a dipole moment forms during the crystal growth process. A polarization phenomenon occurs naturally without an externally applied electric field, which is also referred to as the spontaneous polarization effect. Moreover, during the crystal growth process, because of the lattice mismatch between the epitaxial layer and the substrate, electric charges between different layers accumulate at the interface due to the force generated by the lattice deformation, which is also referred to as the piezoelectric polarization effect.

The existence of the aforementioned polarization effects (e.g., including the spontaneous polarization effect and the piezoelectric polarization effect) will affect the energy band structures of the semiconductor light-emitting device. These effects are especially pronounced in the quantum wells (QWs), also referred to as the quantum-confined Stark effect (QCSE). In this situation, the energy band will severely slanted under the influence of the strong polarized electric fields, such that the electrons and holes are respectively confined at the two sides of the quantum wells. Accordingly, the degree of spatial overlap of the electron and hole wavefunctions is reduced, the radiative lifetime is increased, and the radiative recombination rate of the electrons and holes and the internal quantum efficiency (IQE) are reduced, and thus lowering the light-emitting efficiency of the semiconductor light-emitting device. Therefore, researchers are urgently working towards enhancing the light-emitting efficiency of the semiconductor light-emitting device by reducing the impact that polarization effects have on the semiconductor light-emitting device.

SUMMARY

The invention provides a manufacturing method of a semiconductor light-emitting device, capable of fabricating a semiconductor light-emitting device having a preferable light-emitting efficiency.

The invention provides a semiconductor light-emitting device having a preferable light-emitting efficiency.

The invention provides a manufacturing method of a semiconductor light-emitting device, including forming a first type doped semiconductor structure on a substrate. The first type doped semiconductor structure includes a base and a plurality of columns extending outward from the base, and each of the columns includes a plurality of sidewall surfaces and a top surface. A light-emitting layer is formed on the sidewall surfaces and the top surface, in which a surface area of the light-emitting layer gradually changes from a side adjacent to the columns to a side away from the columns. A second type doped semiconductor layer is formed on the light-emitting layer. A first conductive layer is formed on the second type doped semiconductor layer. A dielectric layer is formed between the columns. The dielectric layer exposes the first conductive layer located on the top surface of each of the columns, in which the dielectric layer includes at least one of a plurality of quantum dots, a plurality of phosphors, and a plurality of metal nanoparticles.

According to an embodiment of the invention, the manufacturing method of the semiconductor light-emitting device further includes forming a current restraining structure on the top surface of the columns before forming the light-emitting layer.

According to an embodiment of the invention, the current restraining structure is an undoped semiconductor structure.

According to an embodiment of the invention, one of the first type and the second type is a p-type, and the other one of the first type and the second type is an n-type.

According to an embodiment of the invention, each of the columns further includes a plurality of slanted surfaces inclined to the sidewall surfaces. Each of the slanted surfaces is connects one of the sidewall surfaces and the top surface, and the light-emitting layer is formed on the slanted surfaces of each of the columns.

According to an embodiment of the invention, the manufacturing method of the semiconductor light-emitting device further includes forming a second conductive layer covering the dielectric layer and the first conductive layer exposed by the dielectric layer.

According to an embodiment of the invention, the manufacturing method of the semiconductor light-emitting device further includes forming a first electrode on the base of the first type doped semiconductor structure, and forming a second electrode on the second conductive layer.

According to an embodiment of the invention, the manufacturing method of the semiconductor light-emitting device further includes removing the substrate before forming the first electrode, so as to form the first electrode on a side of the first type doped semiconductor structure opposite to the columns.

According to an embodiment of the invention, forming the first type doped semiconductor structure includes forming the base of the first type doped semiconductor structure, an insulating layer, and a transfer printing layer sequentially on the substrate. The transfer printing layer is patterned to form a plurality of mask patterns. The insulating layer is patterned by using the mask patterns as a mask to form a plurality of holes. The mask patterns are then removed. A material of the first type doped semiconductor structure is grown in the holes to form the columns, in which each of the columns extends outward from the base in one of the holes.

According to an embodiment of the invention, a diameter of the columns extending out of the holes is greater than or equal to a diameter of the holes.

The invention also provides a semiconductor light-emitting device fabricated by the afore-described manufacturing method.

In summary, embodiments of the invention grow a light-emitting layer on the non-polar direction (e.g., on the sidewall surfaces of the columns of the first type doped semiconductor structure), so as to reduce the polarization effects on the semiconductor light-emitting device. Accordingly, embodiments of the invention can reduce the effect the internal electric field has on the semiconductor light-emitting device, improve the energy band curving issue, enhance the overlap of the electron and hole wavefunctions, and enhance the internal quantum efficiency, thereby fabricating a semiconductor light-emitting device with a preferable light-emitting efficiency.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5D' is a cross-sectional view of a semiconductor light-emitting device according to another embodiment of the invention.

FIG. 5G' is a cross-sectional view of a semiconductor light-emitting device according to an embodiment of the invention.

DESCRIPTION OF EMBODIMENTS

Figure 1:
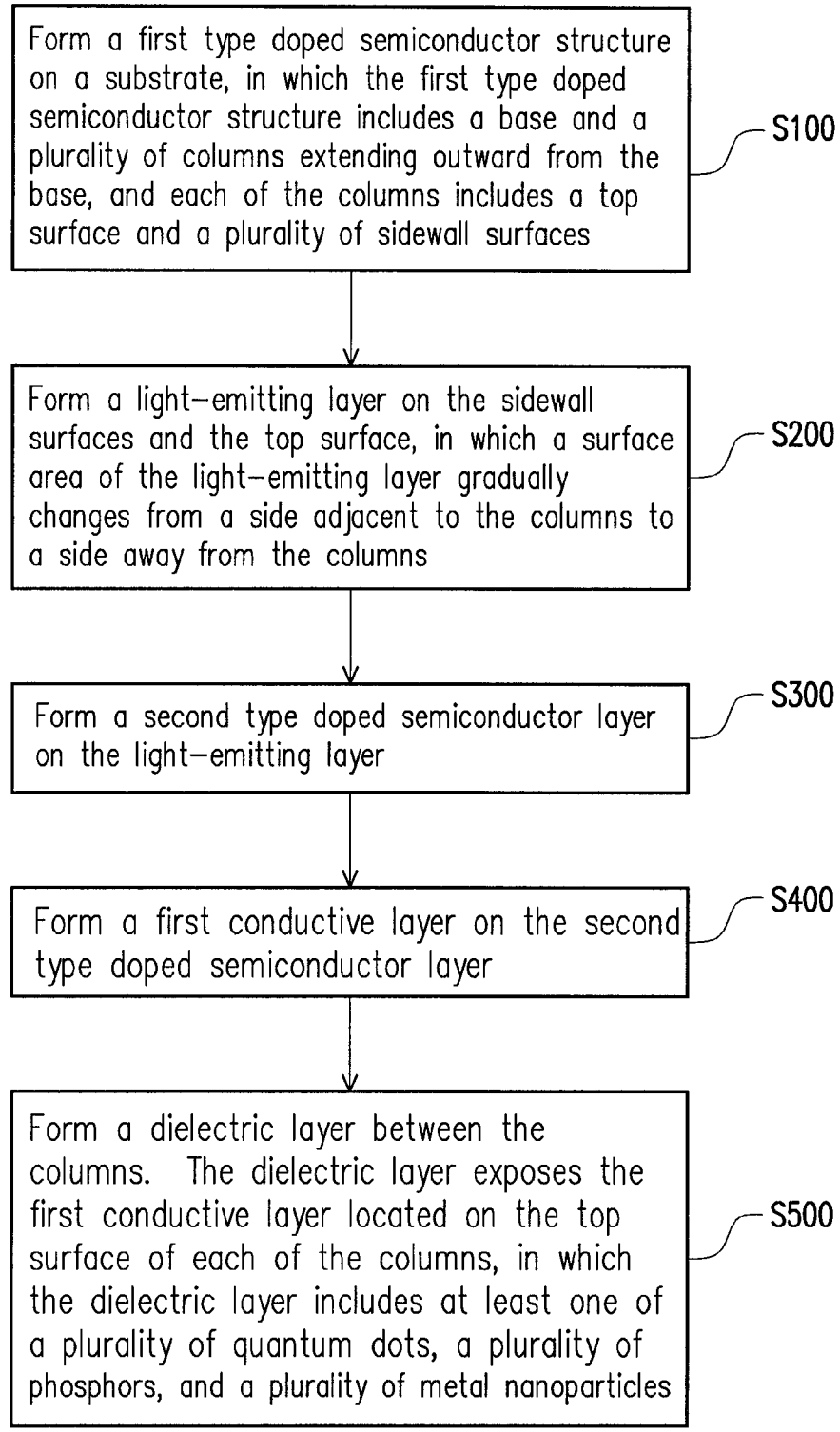
FIG. 1 is a flowchart of a manufacturing method of a semiconductor light-emitting device according to an embodiment of the invention.

FIG. 1 is a flowchart of a manufacturing method of a semiconductor light-emitting device according to an embodiment of the invention. With reference to FIG. 1, a manufacturing method of a semiconductor light-emitting device according to the present embodiment includes the following steps. A first type doped semiconductor structure is formed on a substrate (Step S100), in which the first type doped semiconductor structure includes a base and a plurality of columns extending outward from the base, and each of the columns includes a top surface and a plurality of sidewall surfaces. A light-emitting layer is formed on the sidewall surfaces and the top surface (Step S200), in which a surface area of the light-emitting layer gradually changes from a side adjacent to the columns to a side away from the columns. A second type doped semiconductor layer is formed on the light-emitting layer (Step S300). A first conductive layer is formed on the second type doped semiconductor layer (Step S400). A dielectric layer is formed between the columns (Step S500). The dielectric layer exposes the first conductive layer located on the top surface of each of the columns, in which the dielectric layer includes at least one of a plurality of quantum dots, a plurality of phosphors, and a plurality of metal nanoparticles.

Detailed description of the manufacturing method of the semiconductor light-emitting device is provided hereafter with reference to FIGS. 2A-2G and FIGS. 5A-5G.

FIGS. 2A-2G are schematic cross-sectional views illustrating a manufacturing process of the first type doped semiconductor structure in the Step S100 of FIG. 1. In the present embodiment, the planar patterns of the first type doped semiconductor structure are fabricated by nanoimprint lithography, for example.

Figure 2A:
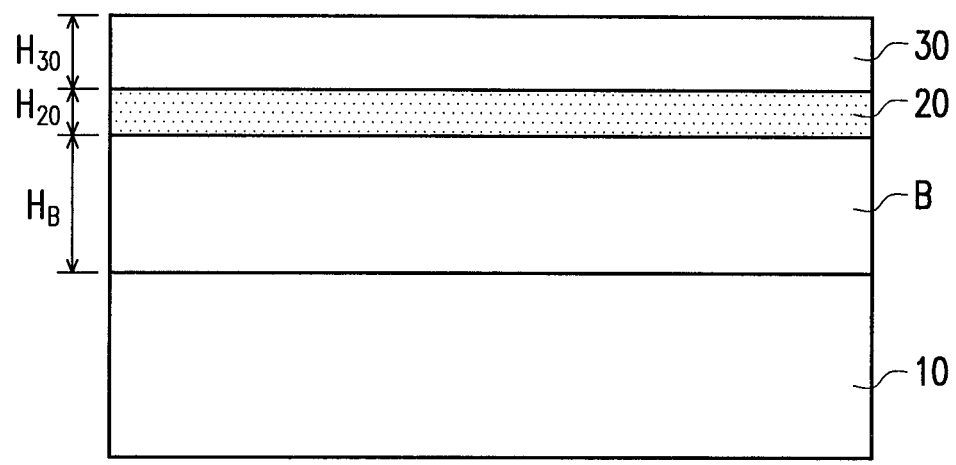
FIGS. 2A-2G are schematic cross-sectional views illustrating a manufacturing process of the first type doped semiconductor structure in a step shown in FIG. 1.

To be specific, with reference to FIG. 2A, a base B of a first type doped semiconductor structure is formed on a substrate 10. In the present embodiment, the base B of the first type doped semiconductor structure may be formed by a metal-organic chemical vapor deposition (MOCVD) method, for example. A thickness $H_B$ of the base B of the first type doped semiconductor structure may be between 0 to 3 μm, although the present embodiment does not limit the method of forming the base B of the first type doped semiconductor structure or the thickness $H_B$ of the base B. In other embodiments, the base B of the first type doped semiconductor structure may also be formed by molecular beam epitaxy (MBE), sputtering, evaporation, pulsed laser deposition (PLD), vapor phase epitaxy (VPE), liquid phase epitaxy (LPE), atomic layer deposition (ALD), or chemical vapor deposition (CVD), for example. Moreover, before growing the base B of the first type doped semiconductor structure, a suitable buffer layer may be selectively grown for different types of substrate 10, so as to enhance the epitaxial quality of subsequent film layers, although the invention does not limit the material, structure, thickness, and formation method of the buffer layer.

The substrate 10 may be a sapphire ($Al_2O_3$) substrate, a SiC substrate, a Si substrate, a GaAs substrate, a GaP substrate, a GaN substrate, a GaAlN substrate, a ZnO substrate, a ZnMgO substrate, a $LiAlO_2$ substrate, a $LiGaO_2$ substrate, or other substrates suitable for the epitaxy. In the present embodiment, a c plane of the sapphire substrate is used as an example to describe the substrate 10, in which the c plane refers to the (0001) crystal plane. N-type GaN is used as a material for the first type doped semiconductor for descriptive purposes, although the invention is not limited thereto.

Thereafter, an insulating layer 20 is formed on the base B of the first type doped semiconductor structure. In the present embodiment, the insulating layer 20 may be formed by a plasma enhanced chemical vapor deposition (PECVD) method, in which a thickness $H_{20}$ of the insulating layer 20 is between 10 nm to 100 nm, for example. Moreover, a material of the insulating layer 20 may be an inorganic material, in which the inorganic material may be silicon oxide, silicon nitride, silicon oxynitride, AlSiO, or stacking layers of at least two of the above materials.

A transfer printing layer 30 is then formed on the insulating layer 20. In the present embodiment, the transfer printing layer 30 is formed by spin-coating, for example, in which a thickness $H_{30}$ of the transfer printing layer 30 is between 20 nm to 1000 nm. Moreover, a material of the transfer printing layer 30 may be a polymer such as a photoresist, for example.

Figure 2B:
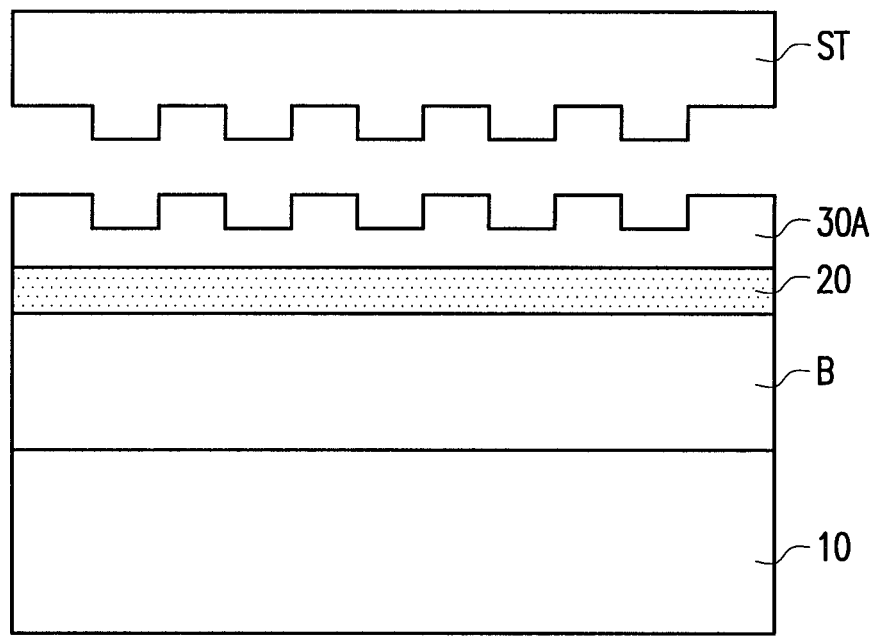
Figure 2C:
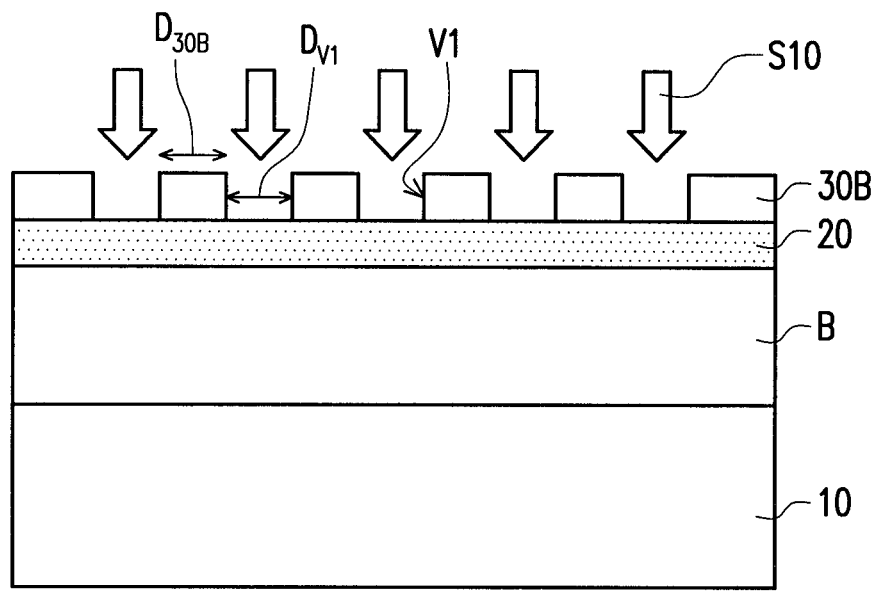

The transfer printing layer 30 is then patterned to form a plurality of mask patterns 30B (depicted in FIG. 2C). In the present embodiment, the method of forming the mask patterns 30B is as follows. With reference to FIG. 2B, a nanoimprinting mold ST having concave and convex patterns is pressed on the transfer printing layer 30, so the concave and convex patterns on the nanoimprinting mold ST are transfer printed to a side of the transfer printing layer 30 in contact with the nanoimprinting mold ST, thereby forming a transfer printer layer 30A having the concave and convex patterns.

With reference to FIG. 2C, the transfer printing layer 30A is then further patterned to form a plurality of mask patterns 30B and a plurality of holes V1, in which the holes V1 is located between two adjacent mask patterns 30B. In the present embodiment, the mask patterns 30B may be formed by performing a reactive ion etching (RIE) Step S10, in which the gas used in the Step S10 may be oxygen, carbon tetrafluoride (CF4), or sulfur hexafluoride (SF6), for example, although the present embodiment does not limit the method for forming the mask patterns 30B. In other embodiments, the mask patterns 30B may also be formed by a photochemical method which irradiates UV rays on ozone gas to generate free radicals for the etching effect.

It should be noted that, in Step S10, a distance $D_{30B}$ of each mask pattern 30B and a diameter $D_{V1}$ of the hole V1 may be selectively fine tuned. Accordingly, the hole diameter and the distance of the subsequent insulating layer formed by using the mask patterns 30B as the mask can be altered, thereby changing the diameter and the distance of the columns of the first type doped semiconductor structure extending from the holes of the insulating layer.

Figure 2D:
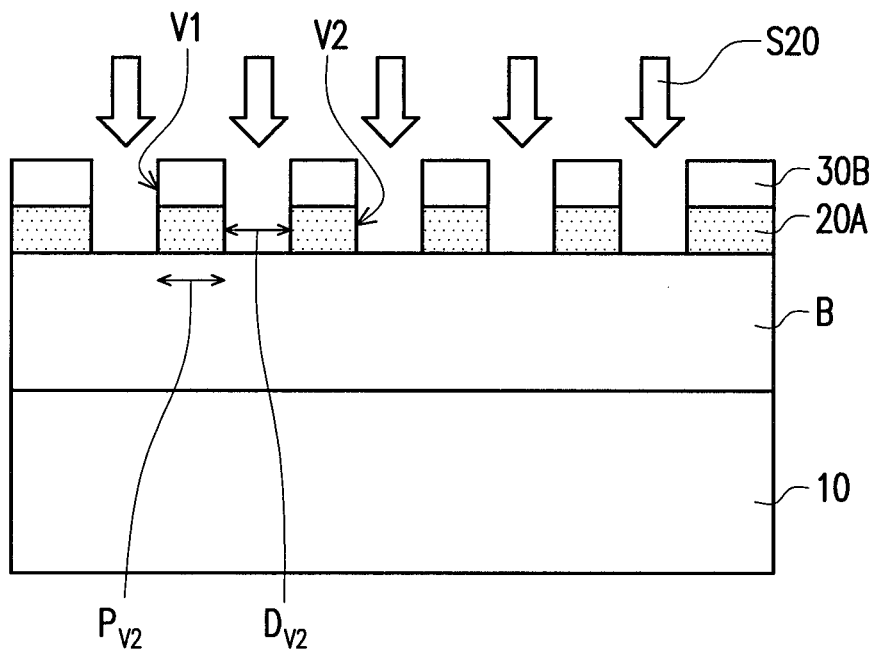

With reference to FIG. 2D, the mask patterns 30B are used as a mask to pattern the insulating layer 20, so as to form an insulating layer 20A having a plurality of holes V2. In the present embodiment, the insulating layer 20 may be patterned by performing a RIE Step S20, in which the gas used in the Step S20 may be trifluoromethane (CHF3), argon, oxygen, carbon tetrafluoride (CF4), or sulfur hexafluoride (SF6), for example. Since the Step S20 is performed on the insulating layer 20 by using the mask patterns 30B as the mask, the shape and the diameter $D_{V2}$ of the holes V2 are substantially the same as the shape and the diameter $D_{V1}$ of the holes V1, and a distance $P_{V2}$ of the holes V2 is substantially the same as the distance $D_{30B}$ of the mask patterns 30B. In the present embodiment, the shape of the hole V2 may be circular, for example, although the invention is not limited thereto.

Figure 2E:
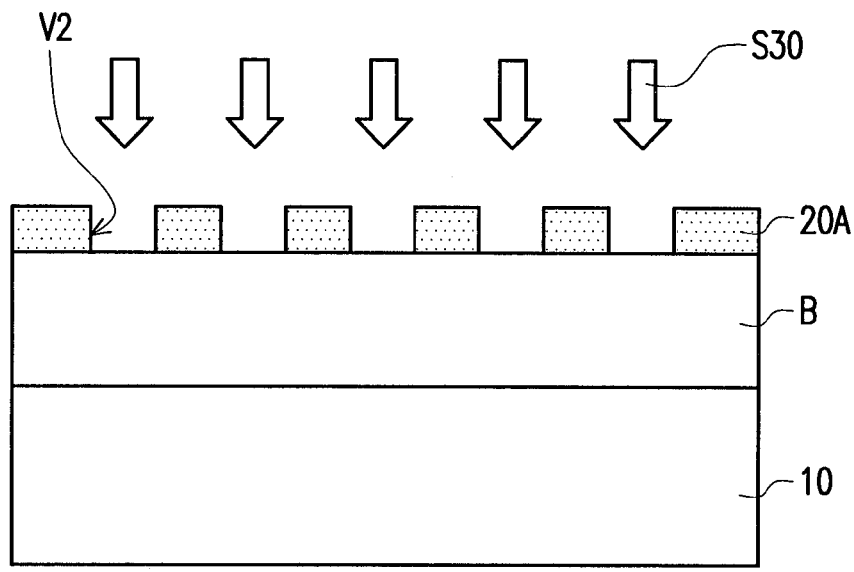

With reference to FIG. 2E, the mask patterns 30B are removed. In the present embodiment, the mask patterns 30B may be removed by performing a RIE Step S30, in which the gas used in the Step S30 may be oxygen, carbon tetrafluoride (CF4), or sulfur hexafluoride (SF6), for example, although the present embodiment does not limit the method for removing the mask patterns 30B. In other embodiments, the mask patterns 30B may also be removed by a photochemical method.

Figure 2F:
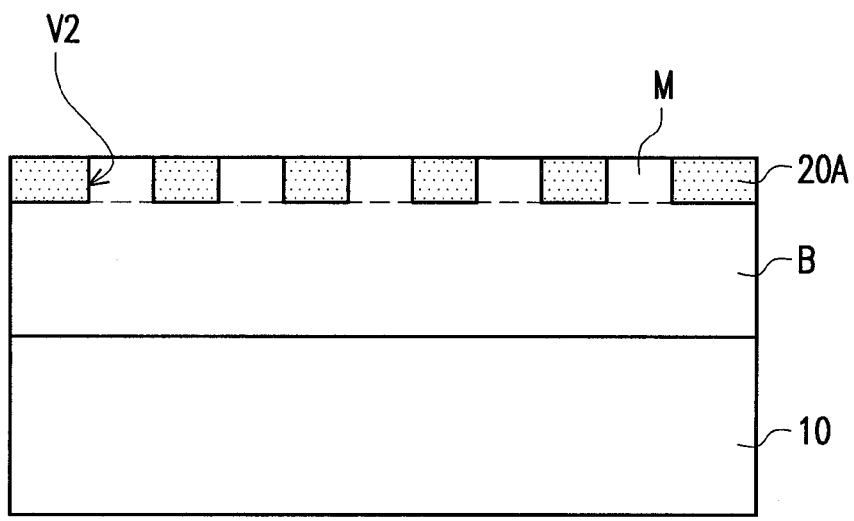

Thereafter, the material of the first type doped semiconductor structure is grown in the holes V2 to form the columns, in which the method of forming the columns is as follows. With reference to FIG. 2F, a material M of the first type doped semiconductor structure is grown in the holes V2. In the present embodiment, the material M of the first type doped semiconductor structure may be grown by a MOCVD method, although the invention is not limited thereto.

Figure 2G:
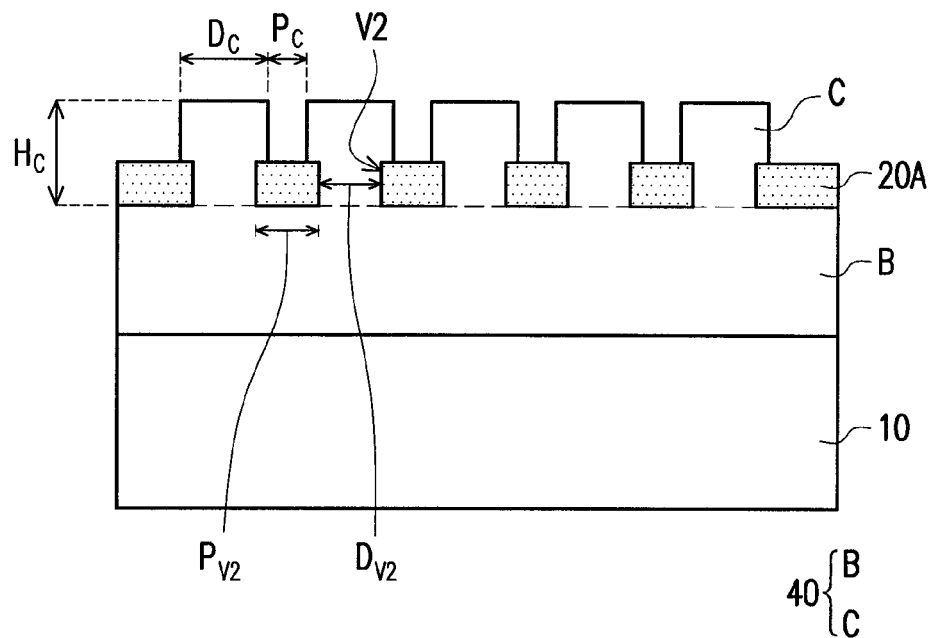

With reference to FIG. 2G, a plurality of columns C are formed thereafter by continually growing the material M of the first type doped semiconductor structure on top of the material M of the first type doped semiconductor structure filling in the holes V2. In the present embodiment, the columns C are formed by a pulsed growth method, for example. The pulsed growth method refers to alternatively providing different elements (e.g., group III or group V elements) forming the chemical compounds during the growth process of the columns C.

The pulsed growth method utilizes a self-catalytic vapor-liquid-solid (VLS) growth process, which uses a droplet of the metal to be grown (e.g., gallium in the present embodiment) as the catalyst for the VLS growth process.

GaN is used as a growth material of the columns C in an illustrative example as follows. In a first half of a growth period of the periodic pulsed growth, a metal source (e.g., gallium) is introduced, and metal droplets are deposited on top of the columns C (e.g., under a high temperature growth conditions), and at this time the nitrogen atom source is turned off. Thereafter, during the later half of the growth period, the metal source is turned off and the nitrogen atom source is introduced, so the metal droplets in a melting state on top of the columns C absorb the provided nitrogen atoms. Moreover, when the super saturation state is reached, gallium nitride precipitates from the bottom of the metal droplets and adds to the height of the columns C. After repeating the foregoing steps of a growth period, the columns C of a first type doped semiconductor structure 40 are formed. From one of the holes V2 of the insulating layer 20A, each of the columns C extends outward from the base B (e.g., extending the direction opposite the substrate 10).

By adjusting a growth time of the columns C, a height $H_C$ of the columns C may be between a few hundreds nm to a few μm. Moreover, the distance $P_C$ of the columns C may be between 10 nm to a few μm. A cross-sectional size $D_C$ of the columns C (e.g., for a hexagonal cross section, $D_C$ is defined as a distance between two parallel surfaces on the hexagonal cross section) may be 10 nm to a few μm, for instance, in which the cross-sectional size $D_C$ of the cross section of the columns C extending out of the holes V2 may be greater than or equal to the diameter $D_{V2}$ of the holes V2. In the present embodiment, the cross-sectional size $D_C$ of the columns C is greater than the diameter $D_{V2}$ of the holes V2 as an example for description, although the invention is not limited thereto. Furthermore, during the growth process of the columns C, the cross-sectional size $D_C$ of the columns C and the distance $P_C$ change according to adjustments to the fabrication parameters. The fabrication parameters may include growth pressure, temperature, constituent elements of the columns C, shape of the holes V2, diameter $D_{V2}$ of the holes V2, and distance $P_{V2}$ of the holes V2, for example.

Figure 3:
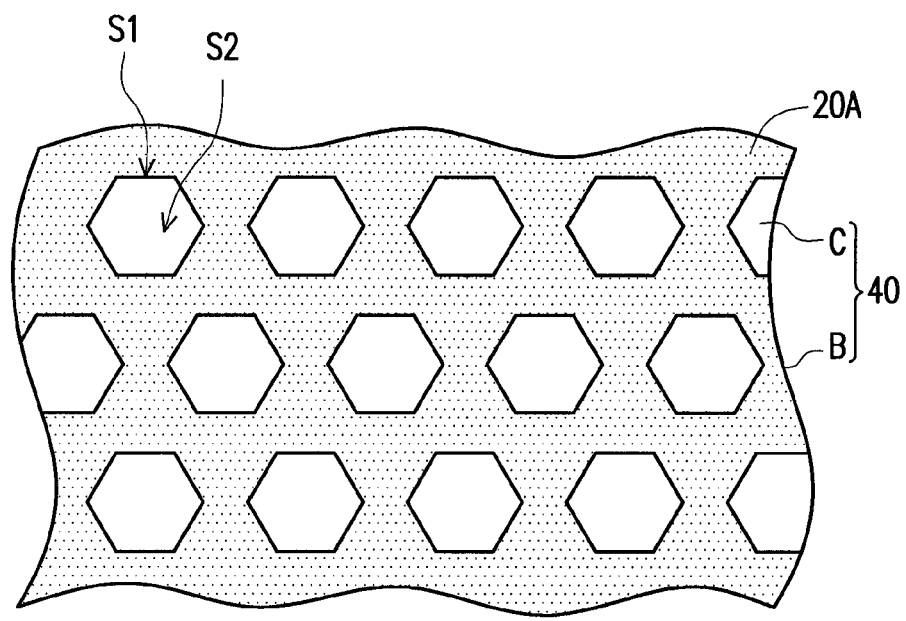
FIG. 3 is a schematic top view of the first type doped semiconductor structure and the insulating layer depicted in FIG. 2G.

FIG. 3 is a schematic top view of the first type doped semiconductor structure 40 and the insulating layer 20A depicted in FIG. 2G. With reference to FIG. 3, the columns C of the present embodiment include a plurality of sidewall surfaces S1 and a top surface S2. In the present embodiment, a cross-sectional area of each of the columns C is hexagonal as an example for description. In other words, each of the columns C of the present embodiment include one top surface S2 and six sidewall surfaces S1. Since the shape of the cross-sectional area of each of the columns C of the first type doped semiconductor structure 40 changes according to the material, structure, and fabrication parameter adjustments, therefore, the invention does not limit the shape of the cross-sectional area of each of the columns C, and the invention also does not limit the hexagonal shape to be a regular hexagonal shape (i.e., the hexagonal shape does not need to have six edges of equal length). In other embodiments, the shape of the cross-sectional area of each of the columns C may be polygonal, rectangular, square, oval, circular, or triangular.

Figure 4:
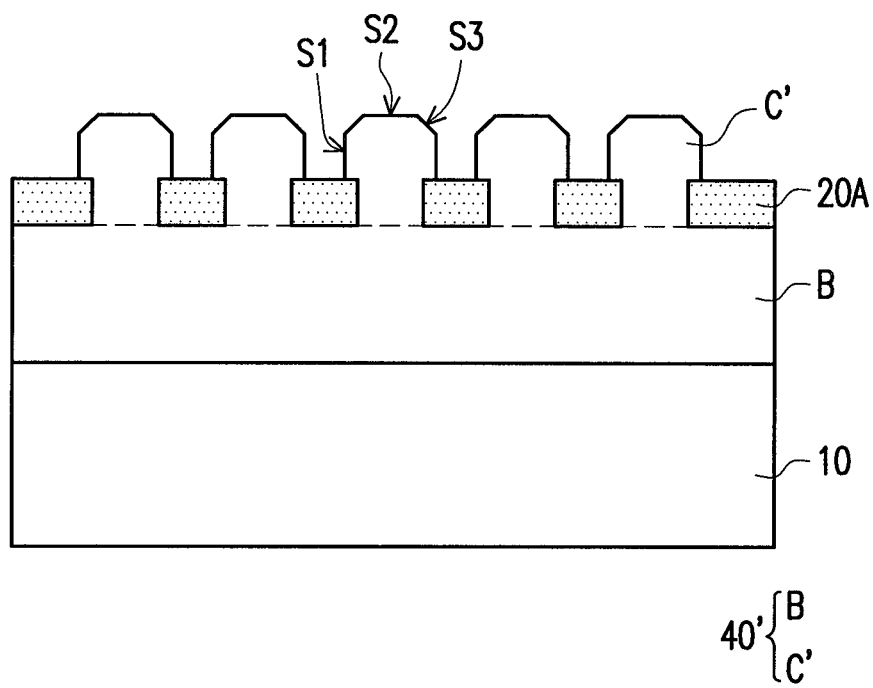
FIG. 4 is a cross-sectional view of a first type doped semiconductor structure according to another embodiment of the invention.

It should be noted that, besides affecting the cross-sectional size $D_C$ of the cross section of the columns C and the distance $P_C$, the aforementioned fabrication parameters may also change the appearance of the columns C. FIG. 4 is used for the description of the columns with another appearance.

FIG. 4 is a cross-sectional view of a first type doped semiconductor structure according to another embodiment of the invention. A first type doped semiconductor structure 40' of FIG. 4 has a similar manufacturing process and structure as the first type doped semiconductor structure 40 of FIG. 2G A difference therebetween lies in that, besides the sidewall surfaces S1 and the top surface S2, the columns C' of the first type doped semiconductor structure 40' further includes a plurality of slanted surfaces S3 inclined to the sidewall surfaces S1 of the columns C', in which each slanted surface S3 connects the top surface S2 and one of the sidewall surfaces S1. In other words, a quantity of the slanted surfaces S3 is equal to a quantity of the sidewall surfaces S1. In the present embodiment, the quantity of the slanted surfaces S3 is six.

Detailed description of the manufacturing method of the semiconductor light-emitting device is provided hereafter with reference to FIGS. 5A-5G. FIGS. 5A-5G are schematic cross-sectional views of a manufacturing process of a semiconductor light-emitting device according to an embodiment of the invention.

Figure 5A:
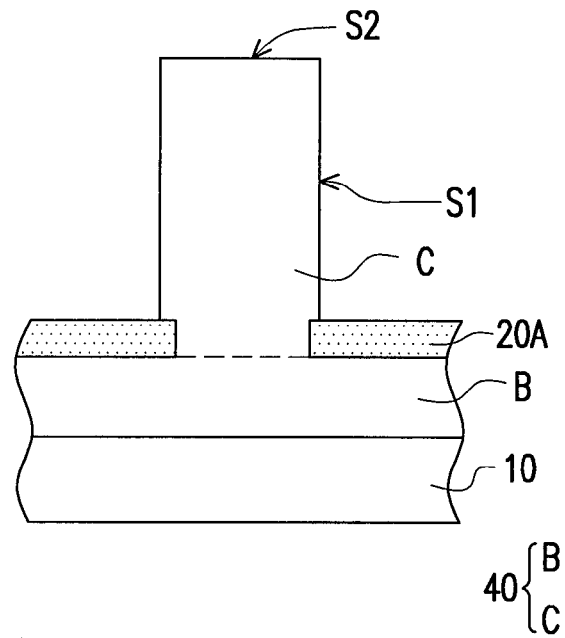
FIGS. 5A-5G are schematic cross-sectional views of a manufacturing process of a semiconductor light-emitting device according to an embodiment of the invention.

With reference to FIG. 5A, the first type doped semiconductor structure 40 is formed on the substrate 10, in which the first type doped semiconductor structure 40 includes the base B and a plurality of columns C extending outward from the base B. The columns C include a plurality of sidewall surfaces S1 and the top surface S2. In the present embodiment, the top surface S2 is parallel to the c-plane, for example, and the sidewall surfaces S1 are non-polar planes perpendicular to the c-plane, in which the non-polar plane may include the m-plane (i.e., the {1-100} plane) or the a-plane (i.e., the {11-20} plane).

Moreover, the first type doped semiconductor structure 40 may be formed by the method described in FIGS. 2A-2G, for example. In the present embodiment, the columns C of the first type doped semiconductor structure 40 are fabricated by nanoimprint lithography, for example, although the invention is not limited thereto. In other embodiments, the columns C of the first type doped semiconductor structure 40 may also be fabricated by photolithography, optical interference, electron beam lithography, focused ion beam lithography, or other suitable methods such as patterning a first type doped semiconductor material layer by etching, and thereby forming the columns C and the base B. The structure depicted in FIG. 2G is used as an example for description below, although the invention is not limited thereto.

It should be noted that, since the columns C are discontinuous structures, that is, there are gaps between the columns C (i.e., the size of the gaps being the distance $P_C$ in FIG. 2G), therefore, the growth of the columns C will reduce the cross section area for the current flow. However, the present embodiment may selectively increase the dopant concentration of the first type doped semiconductor structure 40 (n-type dopant is used in the present embodiment as an example) to enhance the conductivity of the first type doped semiconductor structure 40 and to reduce the resistance of the semiconductor light-emitting device.

Figure 5B:
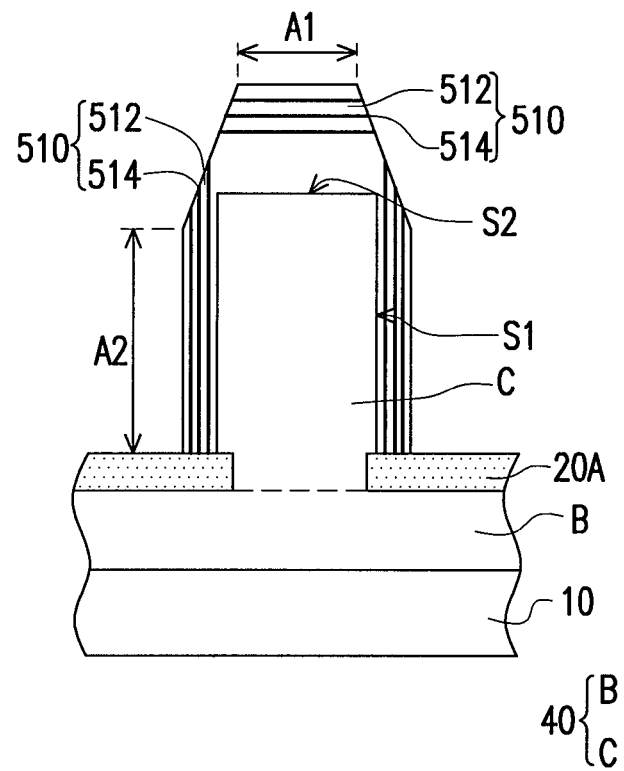

With reference to FIG. 5B, a light-emitting layer 510 is formed on the sidewall surfaces S1 and the top surface S2. In the present embodiment, the light-emitting layer 510 may be formed by MOCVD, MBE, ALD, PLD, or CVD, for example.

The light-emitting layer 510 may be a quantum well layer or a multiple quantum well (MQW) layer. The present embodiment uses the MQW layer as an example for description. Furthermore, the light-emitting layer 510 may include a plurality of quantum barrier layers 512 and a plurality of quantum well layers 514, in which the quantum barrier layers 512 and the quantum well layers 514 are alternately stacked. In the present embodiment, the light-emitting layer 510 uses three periodic quantum barrier layers 512 and quantum well layers 514 as an example for description, although the invention is not limited thereto.

Moreover, GaN is used as a material of the quantum barrier layers 512 in the present embodiment as an example, and InGaN is used as a material of the quantum well layers 514 as an example, although the invention is not limited thereto. In other embodiments, the chemical formulas of the quantum well layers 514 and the quantum barrier layers 512 may be $In_xGa_yAl_{1-x-y}N$ and $Ga_zAl_{1-z}N$, respectively, in which x, y, and z represent the molar ratios of the elements, and x, y, and z are between 0 and 1. Alternatively, the chemical formulas of the quantum well layers 514 and the quantum barrier layers 512 may be $Cd_xZn_yMg_{1-x-y}O$ and $Zn_zMg_{1-z}O$, respectively, in which x, y, and z are between 0 and 1. It should be noted that, people having ordinary skill in the art may adjust the contents of the elements constituting the quantum barrier layers 512 and the quantum well layers 514 in the light-emitting layer 510 (e.g., adjusting the contents of indium and gallium, the contents of indium, gallium, and aluminum, or the contents of cadmium, zinc, and magnesium), in order for the semiconductor light-emitting device to emit light of different wavelengths.

Moreover, the surface area of the light-emitting layer 510 gradually changes from a side adjacent to the column C to a side away from the column C, thereby forming a truncated pyramid structure with the top part cut off. Specifically, a surface area A1 of the light-emitting layer 510 gradually decreases from a side adjacent to the top surface S2 of the column C to a side away from the top surface S2 of the column C, and a surface area A2 of the light-emitting layer 510 gradually decreases from a side adjacent to the sidewall S1 of the column C to a side away from the sidewall S1 of the column C. The surface areas A1 and A2 are respectively the surface areas of the light-emitting layer 510 parallel to the top surface S2 and the sidewalls S1. It should be mentioned that, in other embodiments, after the growth of the light-emitting layer, the top part of the column C can also form a pyramid structure. In other words, after the growth of the light-emitting layer, the top part of the column C can form the pyramid shape or the truncated pyramid shape, and the invention does not limit the shape of the top part of the column C.

Compared to conventional techniques with the light-emitting layer 510 being formed on a two-dimensional (2D) first type doped semiconductor layer, and the contact surface of the light-emitting layer and the first type doped semiconductor layer being a plane parallel to the substrate, the light-emitting layer 510 of the present embodiment is formed on the 3D first type doped semiconductor layer 40 having protrusions and recessions (e.g., the light emitting layer 510 is formed on the sidewall surfaces S1 and the top surface S2 of the column C). Therefore, in the present embodiment the contact surface area of the light-emitting layer 510 and the first type doped semiconductor structure 40 is larger. In other words, compared with conventional techniques, the semiconductor light-emitting device of the present embodiment can have a larger effective light-emitting region.

It should be noted that, in the c-plane, when voltage is applied to the semiconductor light-emitting device, the generation of the polarized field may likely cause the quantum-confined Stark effect in the quantum wells. This effect reduces the light-emitting efficiency of the semiconductor light-emitting device. Generally speaking, in order to suppress the quantum-confined Stark effect, conventional techniques adopt non-polar or semi-polar substrates to substitute for the aforementioned c-plane (polarized surface) substrate in order to grow each layer of the semiconductor light-emitting device. However, non-polar or semi-polar substrates either have great difficulty growing high crystal quality light-emitting devices, or the manufacturing costs are very high.

Comparatively, the present embodiment forms the first type doped semiconductor structure 40 having the columns C, and forms the light-emitting layer 510 on the sidewalls S1 of the columns C of the first type doped semiconductor structure 40, thereby fabricating the non-polar light-emitting layer 510. Therefore, the present embodiment can suppress the quantum-confined Stark effect without growing each layer of the semiconductor light-emitting device on non-polar or semi-polar substrates. Furthermore, the present embodiment can reduce the effect the internal electric field has on the semiconductor light-emitting device, improve the bandgap curving issue, enhance the overlap of the electron and hole wavefunctions, and enhance the internal quantum efficiency, thereby fabricating a semiconductor light-emitting device with a preferable light-emitting efficiency.

Figure 5C:
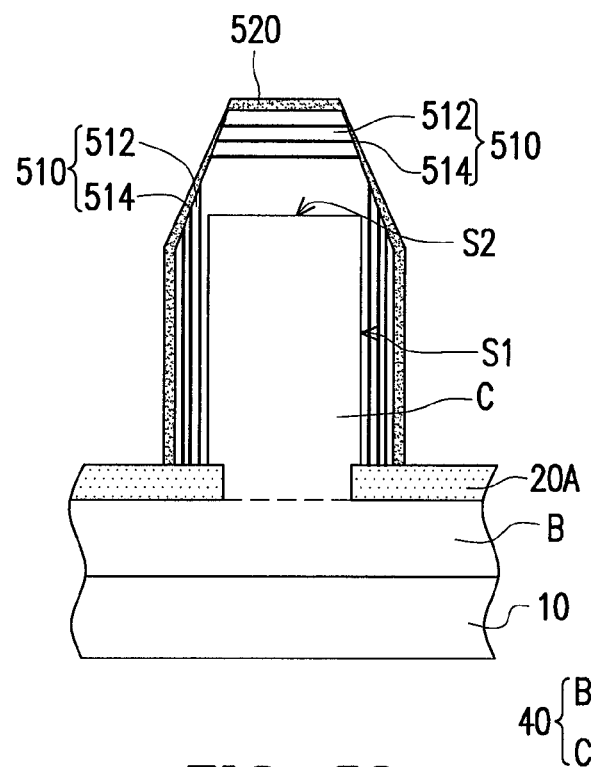

With reference to FIG. 5C, a second type doped semiconductor layer 520 is formed on the light-emitting layer 510, in which the second type doped semiconductor layer 520 is, for example, conformal with the light-emitting layer 510. The second type doped semiconductor layer 520 may be formed by MOCVD, MBE, ALD, PLD, or CVD, for example. Moreover, one of the first type and the second type is a p-type, and the other of the first type and the second type is an n-type. The present embodiment uses the second type as the p-type as an example for description, although the invention is not limited thereto.

Figure 5D:
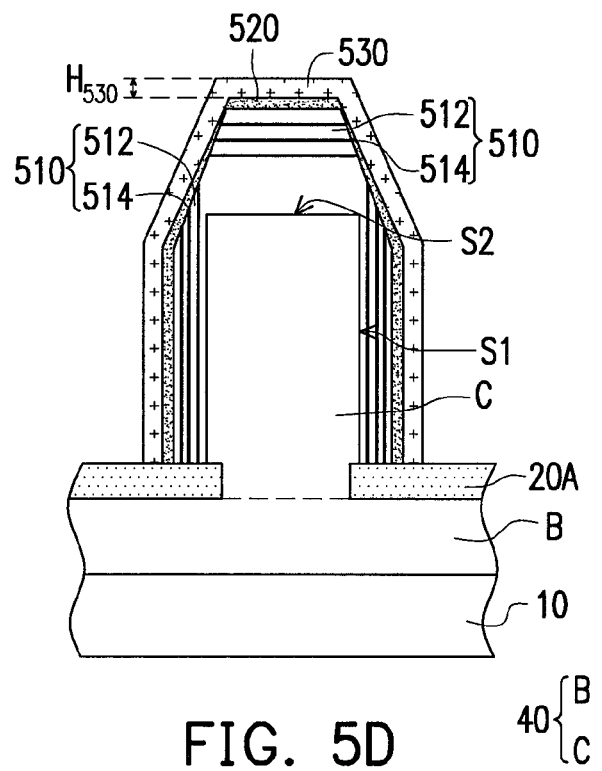
Figure 5D:
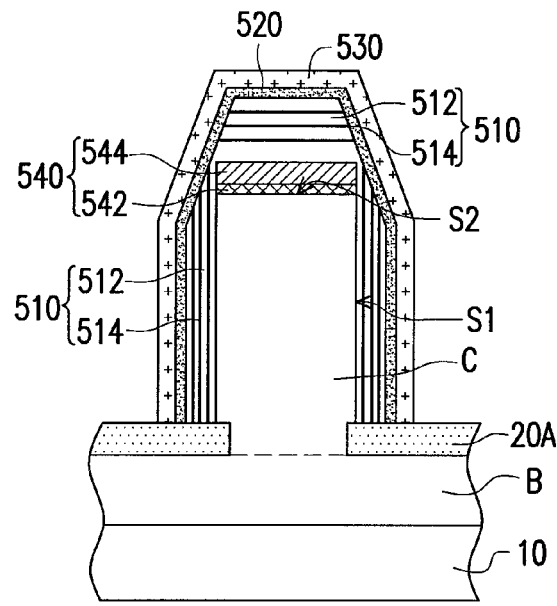

With reference to FIG. 5D, a first conductive layer 530 is formed on the second type doped semiconductor layer 520, in which the first conductive layer 530 is, for example, conformal with the second type doped semiconductor layer 520. Moreover, a thickness $H_{530}$ of the first conductive layer 530 is 50 nm, for example, although the invention is not limited thereto. In the present embodiment, the first conductive layer 530 may be formed by MBE, although the invention is not limited thereto. In other embodiments, the first conductive layer 530 may also be formed by MOCVD, ALD, PLD, or CVD, for example. Moreover, in the present embodiment, a material of the first conductive layer 530 may be GaZnO, although the invention is not limited thereto. In other embodiments, the material of the first conductive layer 530 may be other suitable transparent conductive materials such as indium tin oxide (ITO), indium zinc oxide (IZO), aluminum tin oxide (ATO), aluminum zinc oxide (AZO), indium germanium zinc oxide (IGZO), any other appropriate transparent conductive materials, or stacking layers of at least two of the above.

In the present embodiment, by comprehensively covering the column C (or comprehensively covering the second type doped semiconductor layer 520) with the first conductive layer 530, the injection current can be spread over the sidewalls S1 of the column C. Accordingly, the non-polar light-emitting layer 510 on the sidewalls S1 of the column C can reach the full light-emitting potential. Moreover, the non-polar light-emitting layer 510 can achieve suppression of the quantum-confined Stark effect, thereby fabricating a semiconductor light-emitting device with preferable light-emitting efficiency.

FIG. 5D' is a cross-sectional view of a semiconductor light-emitting device according to another embodiment of the invention. With reference to FIG. 5D', before forming the light-emitting layer 510, the present embodiment can selectively form a current restraining structure 540 on the top surface S2 of the column C, in which the current restraining structure 540 is an undoped semiconductor structure, for example. The undoped semiconductor structure may be an undoped aluminum gallium nitride layer, an undoped gallium nitride layer, or stacking layers of the two. In the present embodiment, stacking layers of an undoped aluminum gallium nitride layer 542 and an undoped gallium nitride layer 544 are used as the undoped semiconductor structure as an example for description, in which the undoped aluminum gallium nitride layer 542 is disposed between the undoped gallium nitride layer 544 and the column C. Moreover, a thickness $H_{542}$ of the undoped aluminum gallium nitride layer 542 is between 10 nm to 100 nm, for example, and a thickness $H_{544}$ of the undoped gallium nitride layer 544 is between 0 nm to 100 nm, for instance.

In the present embodiment, by forming the current restraining structure 540 on the top surface S2 of the column C, the resistance of the injection current flowing through the top part of the pyramid structure can be increased. Accordingly, a majority of the injection current flows to the sidewalls S1 of the column C for effective light emission. Under this type of structure (e.g., a structure including the current restraining layer 540), the non-polar light-emitting layer 510 on the sidewalls S1 of the column C can fully reach the function of light emission. Moreover, the non-polar light-emitting layer 510 can achieve suppression of the quantum-confined Stark effect, thereby fabricating a semiconductor light-emitting device with preferable light-emitting efficiency.

The structure depicted in FIG. 5D' is used as an example for description below, although the invention is not limited thereto. The manufacturing process described below is suitable for the structure shown in FIG. 5D.

Figure 5E:
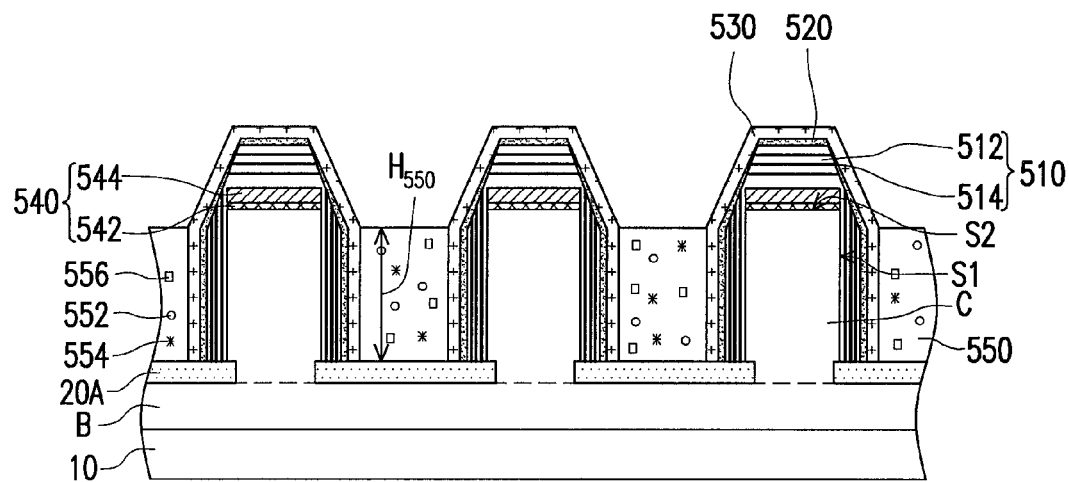

With reference to FIG. 5E, a dielectric layer 550 is formed between the columns C. In the present embodiment, the dielectric layer 550 is formed by spin coating the liquid dielectric layer and then curing, electron beam evaporation, sputtering, ALD, and CVD, for example, although the invention is not limited thereto. Moreover, a thickness $H_{550}$ of the dielectric layer 550 is, for example, the same as the bottom part of the pyramid structure. In other words, the dielectric layer 550 exposes the first conductive layer 530 located on the top surface S2 of each of the columns C. Furthermore, a material of the dielectric layer 550 may be spin-on-glass (SOG), PMMA, polyimide, polymer, transparent photoresist, or other suitable materials.

The dielectric layer 550 may further include at least one of a plurality of quantum dots 552, a plurality of phosphors 554, and a plurality of metal nanoparticles 556. The quantum dots 552 may be single-element or core-shell semiconductor nanoparticles, in which a material thereof is ZnSe, ZnS, CdSe, CdS, PbSe, PbS, or a combination of two of the above. Furthermore, the metal nanoparticles 556 may also be single-element or core-shell metal nanoparticles, in which a material thereof is silver, gold, a combination of silver and silicon oxide, or a combination of gold and silicon oxide.

Figure 5F:
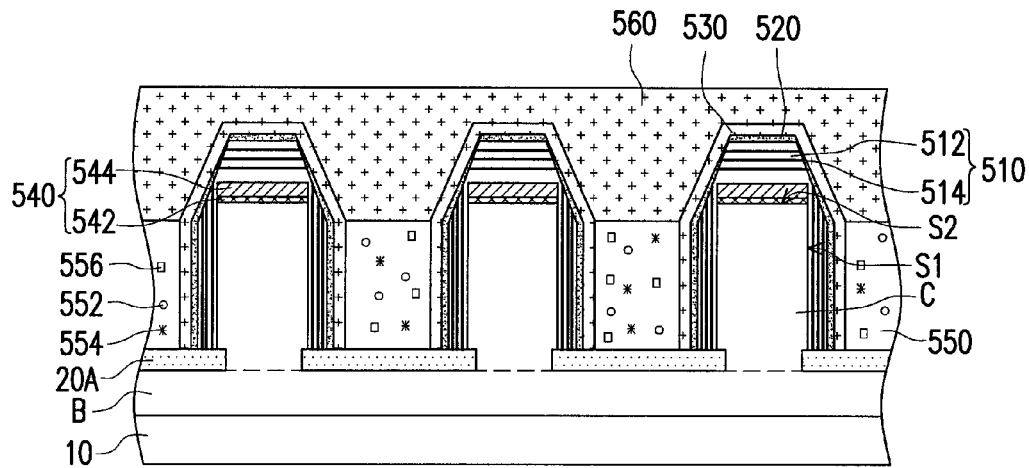

In the present embodiment, the quantum dots 552 and/or the phosphors 554 in the dielectric layer 550 can absorb the short wavelength light from the light-emitting layer 510 while emitting the long wavelength light. Therefore, the semiconductor light-emitting device can emit colored light of different wavelengths, mix light of different wavelengths to form white light or light of a particular needed color, and accordingly enhance the color rendering index (CRI) of the semiconductor light-emitting device. In addition, the surface plasmon coupling effect of the metal nanoparticles 556 in the dielectric layer 550 can enhance the internal quantum efficiency and the light extraction efficiency of the semiconductor light-emitting device, as well as enhance the light-emitting efficiency. With reference to FIG. 5F, the semiconductor light-emitting device of the present embodiment may further form a second conductive layer 560, in which the second conductive layer 560 covers the dielectric layer 550 and the first conductive layer 530 exposed by the dielectric layer 550. In the present embodiment, the second conductive layer 560 may be formed by MBE, MOCVD, ALD, PLD, CVD, electron beam evaporation, and sputtering, for example.

Moreover, a material of the second conductive layer 560 may be the same as the material of the first conductive layer 530 described earlier. Specifically, the material of the second conductive layer 560 may be other suitable transparent conductive materials such as indium tin oxide (ITO), indium zinc oxide (IZO), aluminum tin oxide (ATO), aluminum zinc oxide (AZO), indium germanium zinc oxide (IGZO), any other appropriate oxide materials, or stacking layers of at least two of the above.

Figure 5G:
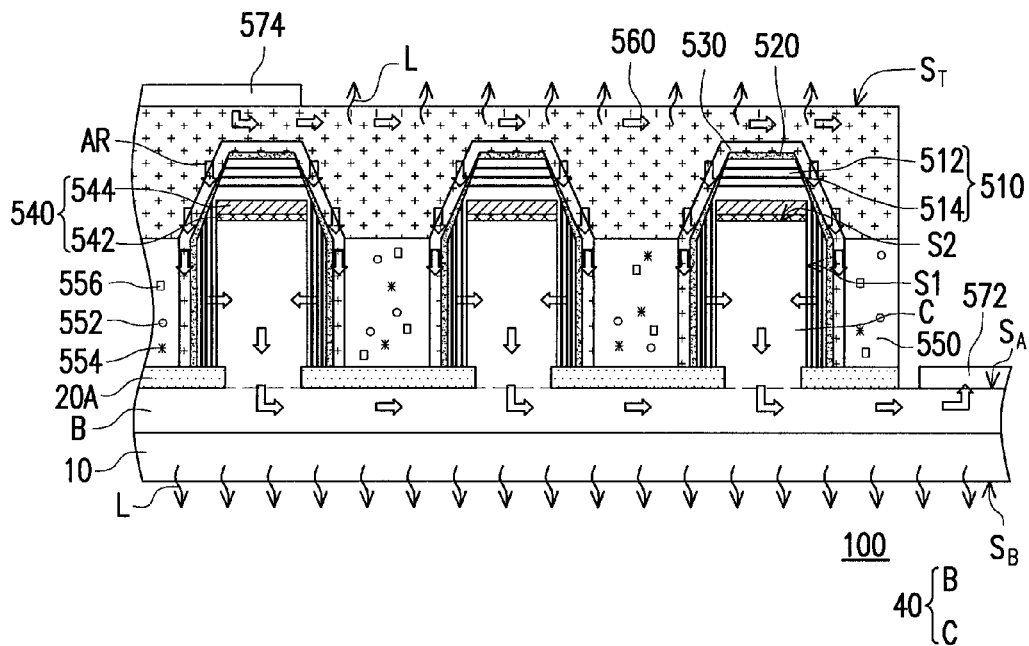
Figure 5G:
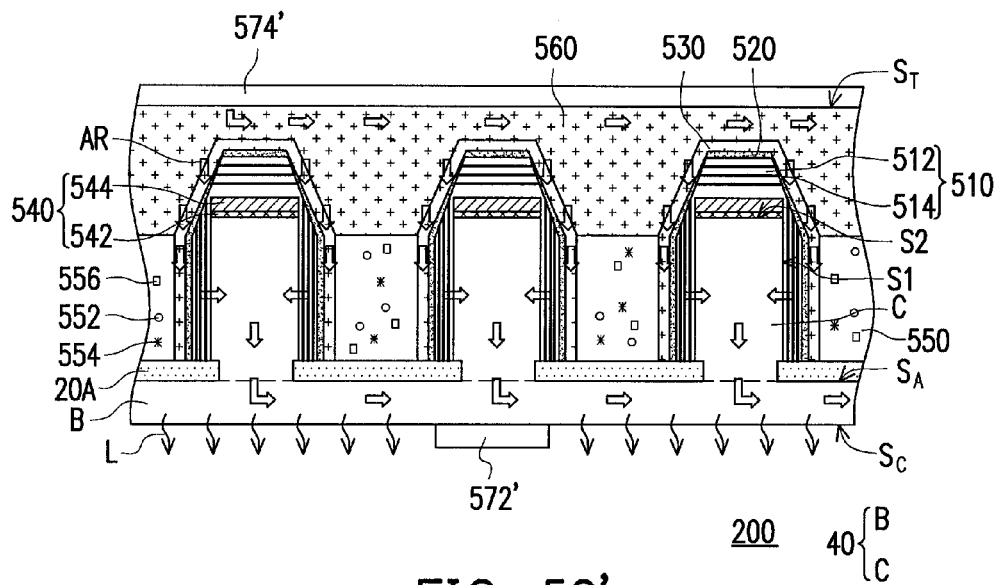

With reference to FIG. 5G, the semiconductor light-emitting device of the present embodiment may further form a first electrode 572 and a second electrode 574, in which the first electrode 572 is disposed on a surface $S_A$ of the base B of the first type doped semiconductor structure 40, and the second electrode 574 is disposed on the second conductive layer 560, for example. At this moment, the initial fabrication of the semiconductor light-emitting device 100 of the present embodiment is preliminarily complete.

In the present embodiment, a material of the substrate 10 may be a transparent material, and thus the semiconductor light-emitting device 100 can be a semiconductor light-emitting device capable of top and bottom light emission. The transparent material refers generally to a material having a high transmittance, and not limited to a material having a 100% transmittance. Furthermore, when voltage is applied to the semiconductor light-emitting device 100, the injection current flows along the direction indicated by a white arrow AR depicted in FIG. 5G. That is, the injection current flows from the second electrode 574 to the sidewalls S1 of the columns C along the first conductive layer 530, and the injection current flows to the first electrode 572 through the second type doped semiconductor layer 520, the light-emitting layer 510, and the columns C in succession. When current flows through the light-emitting layer 510, the light-emitting layer 510 emits light beams L. The light beams L can be emitted from a top surface $S_T$ of the second conductive layer 560, or the light beams L can be emitted from a smooth bottom surface $S_B$ of the substrate 10.

In the present embodiment, due to the configuration of at least one of the quantum dots 552, the phosphors 554, and the metal nanoparticles 556, the light L emitted from the light-emitting layer 510 can bombard at least one of the quantum dots 552, the phosphors 554, and the metal nanoparticles 556. Accordingly, the aforementioned effects such as the enhancement of the color rendering index, the internal quantum efficiency, the light extraction efficiency, or the overall light-emitting efficiency can be achieved.

Moreover, by the configuration of the current restraining structure 540, a majority of the injection current flows to the sidewalls S1 of the columns C, such that the non-polar light-emitting layer 510 on the sidewalls S1 fully achieves the suppression of the quantum-confined Stark effect. Therefore, the semiconductor light-emitting device 100 of the present embodiment can achieve a preferable light-emitting efficiency.

The configuration of the first electrode 572 and the second electrode 574 is merely an example for description, although the invention is not limited thereto. Another configuration of the first electrode 572 and the second electrode 574 is described with reference to FIG. 5G'.

FIG. 5G' is a cross-sectional view of a semiconductor light-emitting device according to another embodiment of the invention. With reference to FIG. 5G', a semiconductor light-emitting device 200 of the present embodiment has structural similarities with the semiconductor light-emitting device 100 of FIG. 5G A difference therebetween lies in the configuration of a first electrode 572' and a second electrode 574' of the semiconductor light-emitting device 200. In addition, the second electrode 574' of the present embodiment fully covers the top surface $S_T$ of the second conductive layer 560, for example. The first electrode 572' is disposed on a bottom surface $S_C$ of the base B of the first type doped semiconductor structure 40, in which the surface $S_C$ and the surface $S_A$ are two opposite surfaces of the base B. In the present embodiment, the first electrode 572' is formed by, for example, removing the substrate 10 before forming the first electrode 572', and forming the first electrode 572' at a side (i.e., the surface $S_C$) of the first type doped semiconductor structure 40 opposite to the columns C. Since the second electrode 574' is a metal electrode, a material of the second electrode 574' is an opaque material, for example. Therefore, the semiconductor light-emitting device 200 of the present embodiment is a single side emitting semiconductor light-emitting device, in which the light L is emitted from the surface $S_C$.

The manufacturing process of the semiconductor light-emitting device depicted in FIGS. 5A-5G' using the structure of the column C' of FIG. 2G is used as an example for description below. Nevertheless, the invention should not be construed as limited to the embodiments described. Another embodiment of the semiconductor light-emitting device is described with reference to FIG. 6.

Figure 6:
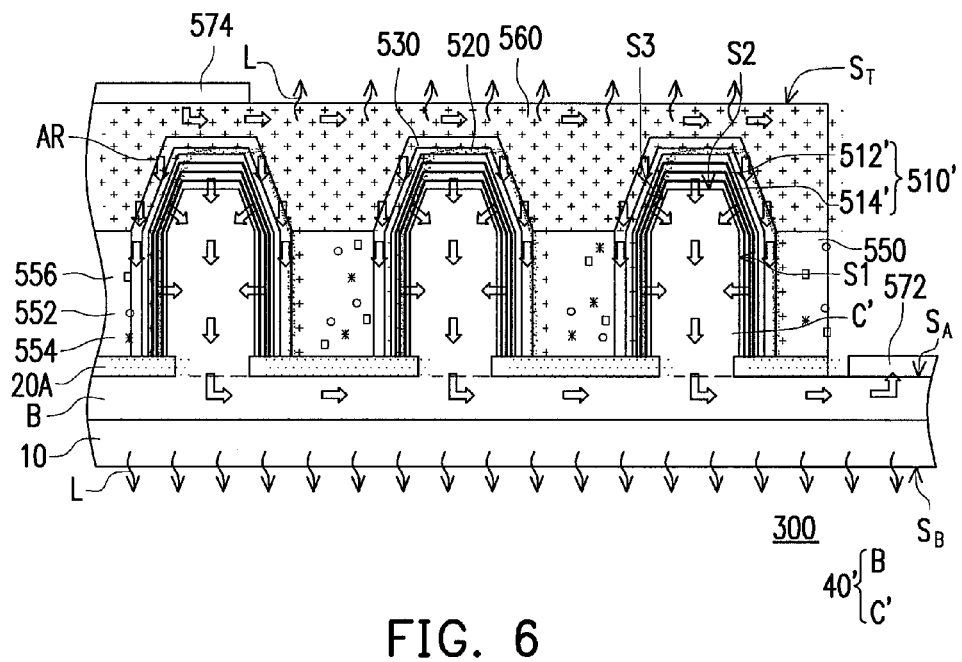
FIG. 6 is a cross-sectional view of a semiconductor light-emitting device according to another embodiment of the invention.

FIG. 6 is a cross-sectional view of a semiconductor light-emitting device according to another embodiment of the invention. With reference to FIG. 6, the manufacturing process of a semiconductor light-emitting device 300 of the present embodiment can be referenced to the manufacturing process depicted in FIGS. 5B-5G A difference between the semiconductor light-emitting device 300 and the semiconductor light-emitting device 100 is that, the columns C' of the semiconductor light-emitting device 300 adopt the structure shown in FIG. 4, and a light-emitting layer 510' can be formed on the slanted surfaces S3 of the columns C'. Therefore, the semiconductor light-emitting device 300 of the present embodiment can emit light from the light-emitting layer 510' on the sidewall surfaces S1, the top surface S2, and the slanted surfaces S3 of the columns C'.

Moreover, the slanted surfaces S3 is a semi-polar surface forming an inclined angle with the c-plane, for example. In the present embodiment, the semi-polar surface is a {1-101} plane, for example. Accordingly, the light-emitting layer 510' formed on the slanted surfaces S3 is a semi-polar light-emitting layer 510', for example. Therefore, due to the non-polar light-emitting layer 510' disposed on the sidewall surfaces S1 and the semi-polar light-emitting layer 510' disposed on the slanted surfaces S3, the semiconductor light-emitting device 300 can achieve the suppression of the quantum-confined Stark effect, thereby fabricating a semiconductor light-emitting device with preferable light-emitting efficiency.

It should be appreciated that, under the structure of the columns C' depicted in FIG. 4, a structure similar to the semiconductor light-emitting device 200 of FIG. 5G' having similar effects of the semiconductor light-emitting devices 300 and 200 can be fabricated, and further elaboration thereof is omitted.

It should be noted that, in the afore-described embodiments, the first type doped semiconductor structures are all grown on the c-plane. That is, the columns C and C' extend outward from the base B along the c-axis. However, the invention does not limit the crystal axis extension directions of the columns C and C'. In other embodiments, the first type doped semiconductor structures having the columns C and C' may also be grown on the a-plane, the m-plane, or other crystal planes. Moreover, the columns C and C' grown on the a-plane, m-plane, or other crystal planes may also have the light-emitting layer 510 grown on the top surface S2, the sidewall surfaces S1, and the slanted surfaces S3, thereby generating polarized, semi-polar, or non-polar light-emitting properties. The device structure and the manufacturing method thereof are similar to FIGS. 5A-5G, FIG. 5G', and FIG. 6. Using the gallium nitride first type doped semiconductor structure having columns grown on the a-plane for example, the shape of the cross-sectional area of the grown columns is an isosceles triangle, and not the aforementioned hexagon. Moreover, the light-emitting layer grown on the top surface is a non-polar a-plane structure. For the light-emitting layer grown on the sidewalls of the isosceles triangle cross section of the columns, one sidewall has a polarized c-plane structure, and the other two sidewalls have semi-polar s-plane structures. The device structure and the manufacturing method thereof are similar to the earlier description, and therefore further elaboration is omitted.

In view of the foregoing, according to embodiments of the invention, a non-polar light-emitting layer is fabricated by forming a first type doped semiconductor structure having columns, and forming the light-emitting layer on the sidewalls of the columns of the first type doped semiconductor structure. Accordingly, the quantum-confined Stark effect can be suppressed, the effect the internal electric field has on the semiconductor light-emitting device can be reduced, the bandgap curving issue can be improved, and the overlap of the electron and hole wavefunctions can be enhanced. Moreover, the internal quantum efficiency is increased, and thereby a semiconductor light-emitting device with preferable light-emitting efficiency can be fabricated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a semiconductor light-emitting device, comprising:
    forming a first type doped semiconductor structure on a substrate, the first type doped semiconductor structure comprising a base and a plurality of columns extending outward from the base, and each of the columns comprises a plurality of sidewall surfaces and a top surface;
    forming a light-emitting layer on the sidewall surfaces and the top surface, wherein a surface area of the light-emitting layer gradually changes from a side adjacent to the columns to a side away from the columns;
    forming a second type doped semiconductor layer on the light-emitting layer;
    forming a first conductive layer on the second type doped semiconductor layer, wherein the first conductive layer is in direct contact with a top surface and sidewalls of the second type doped semiconductor layer;
    forming a dielectric layer between the columns, the dielectric layer exposing the first conductive layer located on the top surface of each of the columns, wherein the dielectric layer comprises at least one of a plurality of quantum dots, a plurality of phosphors, and a plurality of metal nanoparticles; and
    forming a current restraining structure on the top surface of the columns before forming the light-emitting layer, wherein the sidewall surfaces of the columns are not covered by the current restraining structure.

2. The manufacturing method of the semiconductor light-emitting device of claim 1, wherein the current restraining structure is an undoped semiconductor structure.

3. The manufacturing method of the semiconductor light-emitting device of claim 1, wherein one of the first type and the second type is a p-type, and the other one of the first type and the second type is an n-type.

4. The manufacturing method of the semiconductor light-emitting device of claim 1, wherein each of the columns further comprises a plurality of slanted surfaces inclined to the sidewall surfaces, each of the slanted surfaces connects one of the sidewall surfaces and the top surface, and the light-emitting layer is further formed on the slanted surfaces of each of the columns.

5. The manufacturing method of the semiconductor light-emitting device of claim 1, further comprising:
    forming a second conductive layer covering the dielectric layer and the first conductive layer exposed by the dielectric layer.

6. The manufacturing method of the semiconductor light-emitting device of claim 5, further comprising:
    forming a first electrode on the base of the first type doped semiconductor structure; and
    forming a second electrode on the second conductive layer.

7. The manufacturing method of the semiconductor light-emitting device of claim 6, wherein before forming the first electrode, further comprising:
    removing the substrate to foul the first electrode on a side of the first type doped semiconductor structure opposite to the columns.

8. The manufacturing method of the semiconductor light-emitting device of claim 1, wherein forming the first type doped semiconductor structure comprises:
    forming the base of the first type doped semiconductor structure, an insulating layer, and a transfer printing layer sequentially on the substrate;
    patterning the transfer printing layer to form a plurality of mask patterns;
    patterning the insulating layer by using the mask patterns as a mask to form a plurality of holes;
    removing the mask patterns; and
    growing a material of the first type doped semiconductor structure in the holes to form the columns, wherein each of the columns extends outward from the base in one of the holes.

9. The manufacturing method of the semiconductor light-emitting device of claim 8, wherein a diameter of the columns extending out of the holes is greater than or equal to a diameter of the holes.

10. A semiconductor light-emitting device, comprising:
a first type doped semiconductor structure comprising a base and a plurality of columns extending outward from the base, and each of the columns comprises a plurality of sidewall surfaces and a top surface;
a light-emitting layer disposed on the sidewall surfaces and the top surface, wherein a surface area of the light-emitting layer gradually changes from a side adjacent to the columns to a side away from the columns;
a second type doped semiconductor layer disposed on the light-emitting layer;
a first conductive layer disposed on the second type doped semiconductor layer, wherein the first conductive layer is in direct contact with a top surface and sidewalls of the second type doped semiconductor layer;
a dielectric layer disposed between the columns, the dielectric layer exposing the first conductive layer located on the top surface of each of the columns, wherein the dielectric layer comprises at least one of a plurality of quantum dots, a plurality of phosphors, and a plurality of metal nanoparticles; and
a current restraining structure disposed on the top surface of the columns, wherein the sidewall surfaces of the columns are not covered by the current restraining structure.

11. The semiconductor light-emitting device of claim 10, wherein the current restraining structure is an undoped semiconductor structure.

12. The semiconductor light-emitting device of claim 10, wherein one of the first type and the second type is a p-type, and the other one of the first type and the second type is an n-type.

13. The semiconductor light-emitting device of claim 10, wherein each of the columns further comprises a plurality of slanted surfaces inclined to the sidewall surfaces, each of the slanted surfaces connects one of the sidewall surfaces and the top surface, and the light-emitting layer is further located on the slanted surfaces of each of the columns.

14. The semiconductor light-emitting device of claim 10, further comprising:
a second conductive layer covering the dielectric layer and the first conductive layer exposed by the dielectric layer.

15. The semiconductor light-emitting device of claim 14, further comprising:
a first electrode disposed on the base of the first type doped semiconductor structure; and
a second electrode disposed on the second conductive layer.

16. The semiconductor light-emitting device of claim 15, wherein the first type doped semiconductor structure is disposed between the first electrode and the second electrode, and the second electrode covers the second conductive layer.

17. The semiconductor light-emitting device of claim 10, further comprising:
an insulating layer disposed on the base of the first type doped semiconductor structure, the insulating layer comprising a plurality of holes, and each of the columns extends outward from the base in one of the holes.

18. The semiconductor light-emitting device of claim 17, wherein a diameter of the columns extending out of the holes is greater than or equal to a diameter of the holes.

19. A manufacturing method of a semiconductor light-emitting device, comprising:
forming a first type doped semiconductor structure on a substrate, the first type doped semiconductor structure comprising a base and a plurality of columns extending outward from the base, and each of the columns comprises a plurality of sidewall surfaces and a top surface;
forming a light-emitting layer on the sidewall surfaces and the top surface, wherein a surface area of the light-emitting layer gradually changes from a side adjacent to the columns to a side away from the columns;
forming a second type doped semiconductor layer on the light-emitting layer;
forming a first conductive layer on the second type doped semiconductor layer;
forming a dielectric layer between the columns, the dielectric layer exposing the first conductive layer located on the top surface of each of the columns, wherein the dielectric layer comprises a plurality of metal nanoparticles; and
forming a current restraining structure on the top surface of the columns before forming the light-emitting layer, wherein the sidewall surfaces of the columns are not covered by the current restraining structure.

20. The manufacturing method of the semiconductor light-emitting device of claim 19, wherein the dielectric layer further comprises at least one of a plurality of quantum dots and a plurality of phosphors.

21. A semiconductor light-emitting device, comprising:
a first type doped semiconductor structure comprising a base and a plurality of columns extending outward from the base, and each of the columns comprises a plurality of sidewall surfaces and a top surface;
a light-emitting layer disposed on the sidewall surfaces and the top surface, wherein a surface area of the light-emitting layer gradually changes from a side adjacent to the columns to a side away from the columns;
a second type doped semiconductor layer disposed on the light-emitting layer;
a first conductive layer disposed on the second type doped semiconductor layer;
a dielectric layer disposed between the columns, the dielectric layer exposing the first conductive layer located on the top surface of each of the columns, wherein the dielectric layer comprises a plurality of metal nanoparticles; and
a current restraining structure disposed on the top surface of the columns, wherein the sidewall surfaces of the columns are not covered by the current restraining structure.

22. The semiconductor light-emitting device of claim 21, wherein the dielectric layer further comprises at least one of a plurality of quantum dots and a plurality of phosphors.

* * * * *